United States Patent [19]

Leupold

[11] Patent Number: 5,319,339
[45] Date of Patent: Jun. 7, 1994

[54] TUBULAR STRUCTURE HAVING TRANSVERSE MAGNETIC FIELD WITH GRADIENT

[75] Inventor: Herbert A. Leupold, Eatontown, N.J.

[73] Assignee: The United States of America as represented by the Secretary of the Army, Washington, D.C.

[21] Appl. No.: 28,483

[22] Filed: Mar. 8, 1993

[51] Int. Cl.$^5$ .............................................. H01F 7/02
[52] U.S. Cl. ..................................... 335/306; 335/302
[58] Field of Search ........................... 335/296–306, 335/210; 315/5.34, 5.35; 250/396 ML; 310/90.5

[56] References Cited

U.S. PATENT DOCUMENTS

| | | | |
|---|---|---|---|
| 3,237,059 | 2/1966 | Meyerer | 335/306 |
| 3,373,388 | 3/1968 | Meyerer | 335/306 |
| 3,436,587 | 4/1969 | Meyerer | 335/306 |
| 4,611,121 | 9/1986 | Miyamura et al. | 250/423 R |
| 4,692,732 | 9/1987 | Leupold et al. | 335/302 |
| 4,701,737 | 10/1987 | Leupold | 335/301 |
| 4,994,778 | 2/1991 | Leupold | 335/306 |

FOREIGN PATENT DOCUMENTS 0156803  7/1987  Japan .................................. 335/306

*Primary Examiner*—Leo P. Picard
*Assistant Examiner*—Raymond Barrera
*Attorney, Agent, or Firm*—Michael Zelenka; William H. Anderson

[57] ABSTRACT

A tubular structure having a transverse magnetic field that varies in either the longitudinal direction or the lateral direction. In one embodiment, a permanent magnet tubular structure has a working magnetic field space that is partially bounded by pole pieces that reduce the height of the working magnetic field space. A laterally varying magnetic field is formed within the tubular structure. In another embodiment, a permanent magnet tubular structure is comprised of sections made of a permanent magnetic material, each section having a different remanence. The adjacent sections, having different remanence, form a linear array resulting in a longitudinally varying magnetic field gradient within the working space. The present invention has many practical applications such as in magnetic resonance imaging.

4 Claims, 3 Drawing Sheets

TUBULAR STRUCTURE HAVING TRANSVERSE MAGNETIC FIELD WITH GRADIENT

GOVERNMENT INTEREST

The invention described herein may be manufactured, used, and licensed by or for the Government for governmental purposes without the payment to me of any royalties thereon.

FIELD OF THE INVENTION

This invention relates generally to tubular permanent magnetic structures having a transverse magnetic field, and more particularly to a magnetic structure having a lateral or longitudinal magnetic field gradient.

BACKGROUND OF THE INVENTION

Tubular magnetic devices are used in many applications for influencing the travel of a charged particle. Permanent magnetic structures have many advantages over large solenoids and bulky power supplies in creating a magnetic field. Permanent magnet tubular devices have been used to create magnetic fields in such applications as traveling wave tubes, klystrons, wigglers, and twisters. An example of the use of a permanent magnet structure for producing a magnetic field in a hollow cylinder is disclosed in U.S. Pat. No. 4,994,778 entitled "Adjustable Twister" issuing to Herbert A. Leupold, the present inventor, on Feb. 19, 1991.

In many applications, such as those in medicine and in particular magnetic resonance imaging techniques, there is an ever increasing need for permanent magnet structures having specialized magnetic fields. While the prior art magnetic structures have provided magnetic fields suitable for their intended purpose, there is a need for other types of magnetic fields that are not readily achievable with known permanent magnet structures.

SUMMARY OF THE INVENTION

The present invention is directed to a tubular permanent magnet structure that creates a transverse magnetic field having a magnetic field strength gradient. In one embodiment, the magnetic field strength varies laterally, and in other embodiments, the magnetic field strength varies longitudinally. In the embodiment having the laterally varying magnetic field, two rectangular working permanent magnets are used. The two rectangular working permanent magnets have a lateral magnetic orientation. Two pole pieces are used to bridge the common poles of the two permanent working rectangular magnets such that a substantially rectangular tube is formed. The pole pieces have an increasing thickness while progressing laterally from one permanent working magnet to the other permanent working magnet. A gap is thereby formed having a gap distance that varies laterally from one working permanent magnet to the other working permanent magnet. Additionally, the thickness of the pole pieces can vary longitudinally only, thereby forming a longitudinal varying magnetic field gradient. Other cladding magnets are used to augment the working magnetic field within the gap formed by the pole pieces, and to reduce any stray or extraneous magnetic fields.

In a another embodiment of the present invention, a tubular permanent magnet structure comprising multiple permanent magnets having a lateral magnetic field is formed from sections. Each of the plurality of sections are placed adjacent to one another forming a linear array. Each of the magnet sections are formed of a magnetic material having a different remanence. The remanence is varied uniformly from one end of the tubular magnet structure to the other end. Each section has a relatively uniform lateral magnetic field. Each section having a different magnetic remanence, the relatively constant lateral magnetic field for each section will vary longitudinally according to the remanence of that section. The decreasing remanence along the longitudinal length of the adjacent sections results in a longitudinally varying magnetic field.

In another embodiment a cylindrical tube is formed from wedge shaped sections of permanent magnetic pieces forming a magic ring and resulting transverse magnetic field within the bore. A longitudinal magnetic field gradient is formed by varying the radial thickness of the magnetic material while progressing along the longitudinal axis.

Accordingly, it is an object of the present invention to provide a permanent magnetic structure having a transverse magnetic field with a magnetic field strength gradient.

It is an advantage of the present invention that a magnetic field is achieved in a compact package.

It is a further advantage of the present invention that there is reduced magnetic field leakage.

It is a feature of the present invention that pole pieces are used to reduce the width of a magnetic gap.

It is another feature of the present invention that remanence of the magnetic material forming a tube varies along the longitudinal length thereof.

It is another feature of the present invention that the radial thickness of magnetic material forming a tube is reduced.

These and other objects, advantages, and features will become readily apparent in view of the following more detailed description.

DETAILED DESCRIPTION OF THE PREFERRED EMBODIMENT

Figure 1:
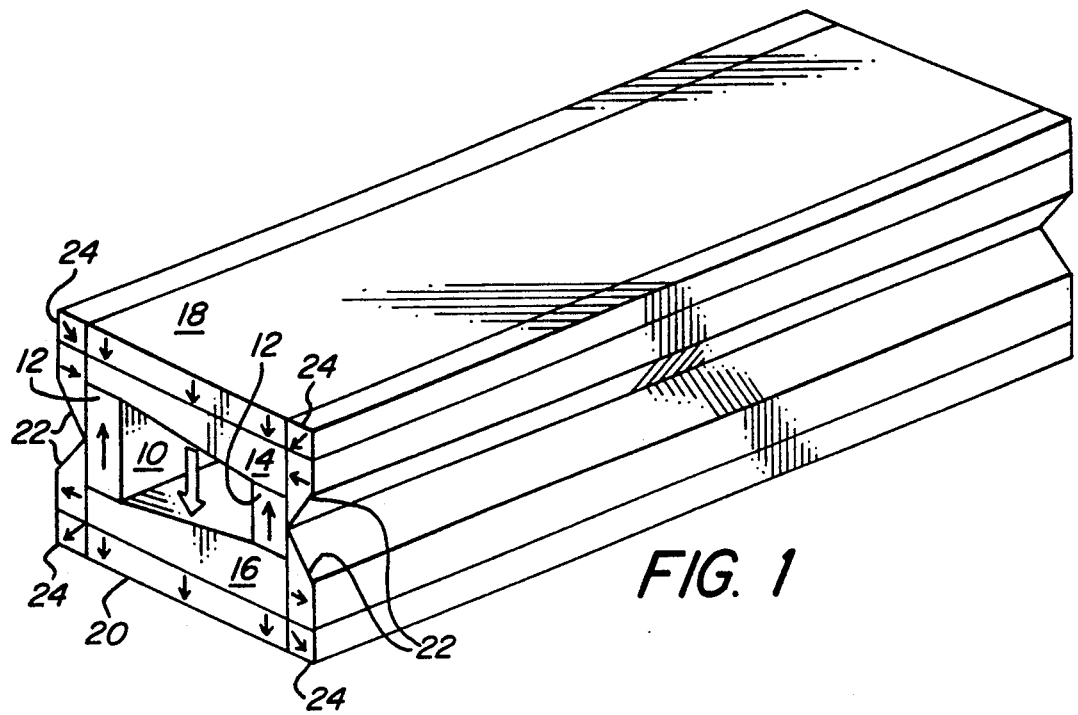
FIG. 1 is a perspective view illustrating one embodiment of the present invention.

FIG. 1 illustrates the tubular structure of the present invention. A working space or gap 10 is formed by two side working magnets 12 and a top pole piece 14 and a bottom pole piece 16. The pole pieces 14 and 16 are preferably made of soft iron or other high saturation high permeability material. Side working magnets 12 are rectangular in shape and extend the longitudinal length of the tubular magnetic structure. Working magnets 12 also have a magnetic orientation as indicated by the arrows thereon. The head of the arrow represents magnetic north while the tail of the arrow represents magnetic south. The large arrow within the working space 10 represents the direction of the magnetic field as a result of the tubular structure of the present invention. Top cladding magnet 18 is placed above pole piece 14.

Bottom cladding magnet 20 is placed below bottom pole piece 16. Side cladding magnets 22 are positioned adjacent the working magnets 12 and top and bottom pole pieces 14 and 16. The side cladding magnets 22 are angled inward near the center of the tubular structure. Corner cladding magnets 24 are positioned at each corner of the tubular structure adjacent the top and bottom cladding magnets 18 and 20 and the side cladding magnets 22. All of the cladding magnets 18, 20, 22, and 24 have a magnetic orientation as indicated by the arrows thereon. The cladding magnets function is to augment the magnetic field within the working space 10, as well as to prevent any stray magnetic fields from emanating from the external surface of the tubular structure.

Figure 2:
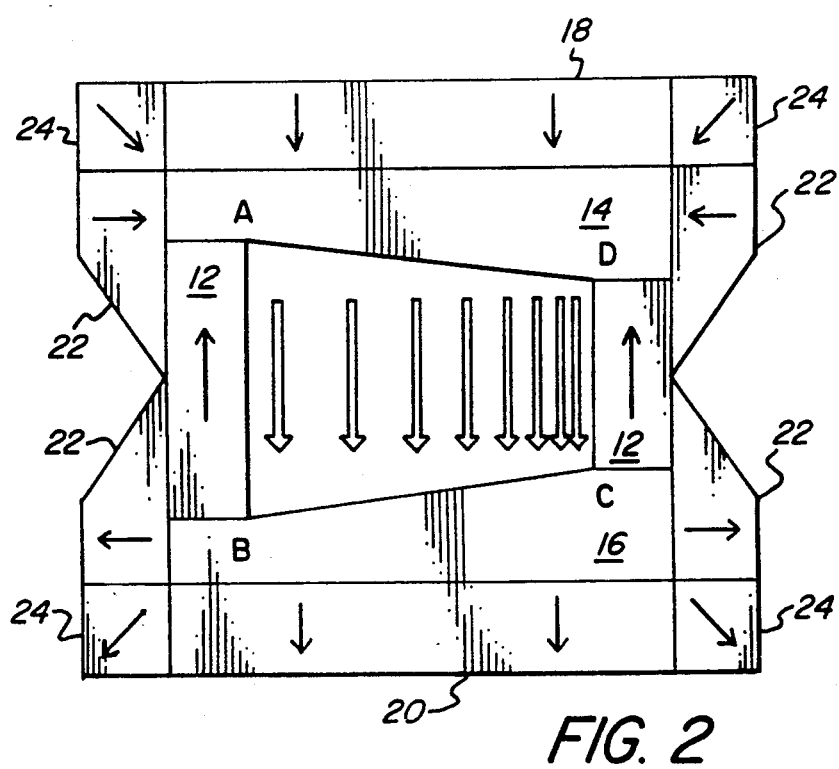
FIG. 2 is a front elevational view of the embodiment illustrated in FIG. 1.

The operation of the device can more clearly be appreciated with reference to FIG. 2. In FIG. 2, the top pole piece 14 increases in thickness while progressing laterally from point A to point D. Similarly, bottom pole piece 16 increases in thickness while progressing laterally from point B to point C. Therefore, the height of the working space 10 between points A and B is greater than the height of the working space between points D and C. The top pole piece 14 forms a magnetic equipotential surface from point A to point D. The bottom pole piece 16 provides a magnetic equipotential surface from point B to C. Therefore, the reduced height from D to C relative to the height from A to B results in a lateral linearly varying magnetic field. The magnetic field in working space 10 increases from the side adjacent points A and B to the side adjacent points D and C.

In another embodiment, pole pieces can be used to make the transverse magnetic field vary longitudinally. The thickness of the pole pieces can be made to vary along the longitudinal length of the magnetic structure. The thickness of the pole pieces along a lateral axis will remain constant. This will result in a longitudinally varying magnetic field that increases longitudinally as the pole pieces get closer together.

Figure 3:
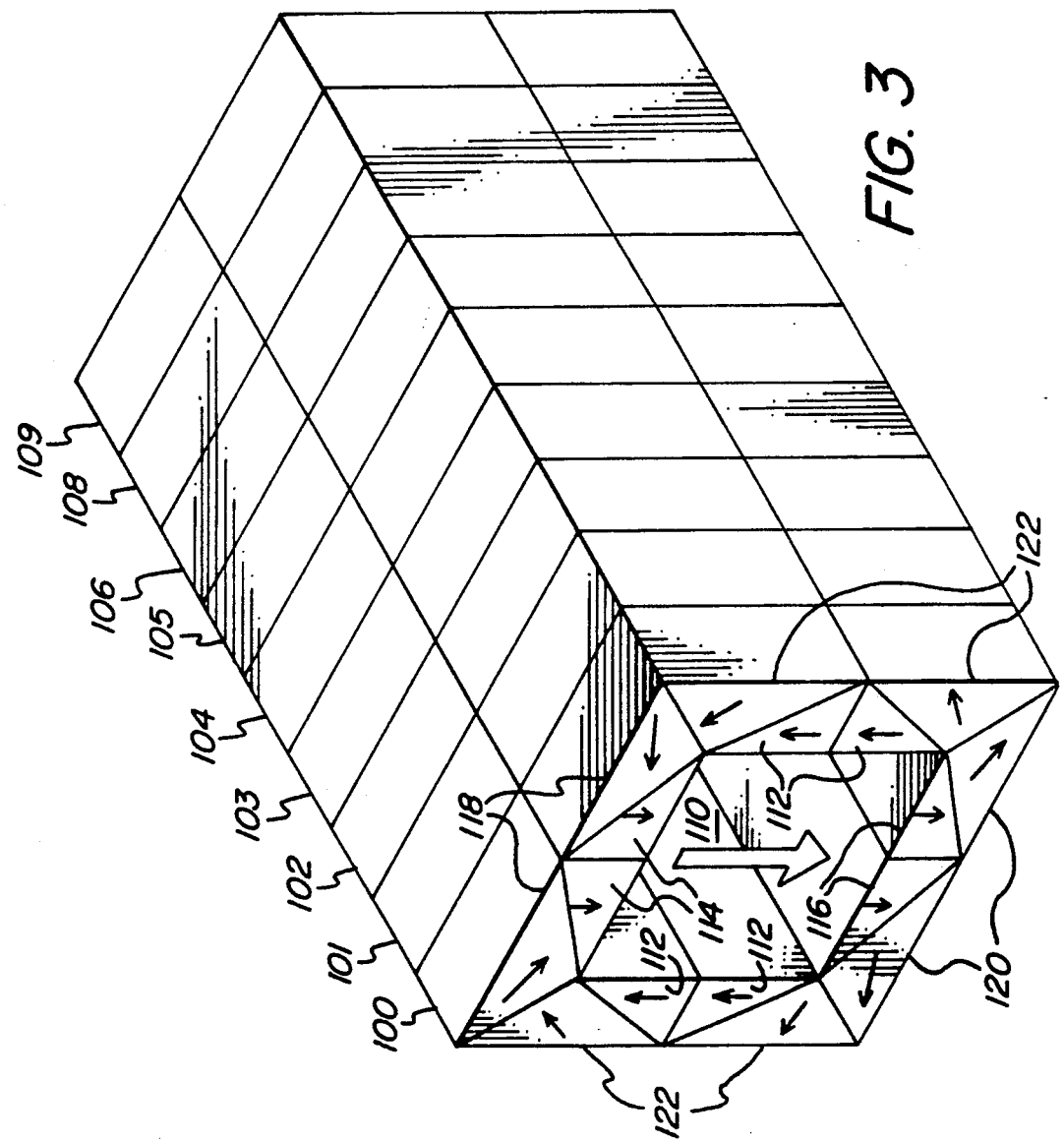
FIG. 3 is a perspective view of another embodiment of the present invention.

FIG. 3 illustrates a second embodiment of the present invention. The tubular magnetic structure in FIG. 3 is comprised of nine rectangular sections, 100, 101, 102, 103, 104, 105, 106, 107, and 108. The sections 100, 101, 102, 103, 104, 105, 106, 107, and 108 are positioned adjacent each other in a longitudinal linear array. Each of the nine sections 100, 101, 102, 103, 104, 105, 106, 107, and 108 are comprised of a magnetic structure as illustrated in Section 100. Rectangular working space 110 is formed by side working magnets 112 and top and bottom working magnets 114 and 116. The working magnets 112, 114, and 116 have a magnetic orientation represented by the arrows thereon. The side working magnets 112 are cladded by cladding magnets 122. The top working magnets 114 are cladded by top cladding magnets 118. The bottom working magnets 116 are cladded by bottom cladding magnets 120 The cladding magnets 118, 120, and 122 help to enhance the working magnetic field within the working space 110 as well as to help prevent and reduce stray magnetic fields from emanating from the exterior surface of the tubular structure. The magnetic structure as illustrated in Section 100 creates a transverse magnetic field in the direction as illustrated in the large arrow in the working space 110.

Each of the sections 100, 101, 102, 103, 104, 105, 106, 107, and 108 are made of a magnetic material having a predetermined remanence. The permanent magnets 112, 114, 116, 118, 120, 122 are formed from a material having a relatively high remanence. The remaining sections 101, 102, 103, 104, 105, 106, 107, and 108 are formed from materials having progressively lower remanence ending with section 109, which has the lowest remanence. As a result, the transverse magnetic field created within these sections will have a magnetic field gradient while progressing longitudinally from one end to the other of the tubular structure. Thereby, a transverse longitudinally varying magnetic field is formed. The magnetic field gradient can be varied depending on the longitudinal thickness of each section and the change in remanence between each section.

For example, when the magnetic remanence of each of the nine sections is reduced by 0.0125% progressively from section 100 to section 108, a total change in remanence of about 6% will result. This results in a magnetic field gradient of approximately 6% from section 100 to section 108. However, there will be a slight disturbance of the magnetic field gradient at the ends of the tubular structure in view of end effects. The end effects can be eliminated by lengthening the tubular structure beyond the region where the field is used or working field. Additionally, creating uniformity in the magnetic gradient can be achieved by reducing the longitudinal thickness of the magnetic sections and correspondingly reducing the percent change in remanence from section to section. The present invention can be applied to other tubular shapes such as polygonal or cylindrical.

Figure 4:
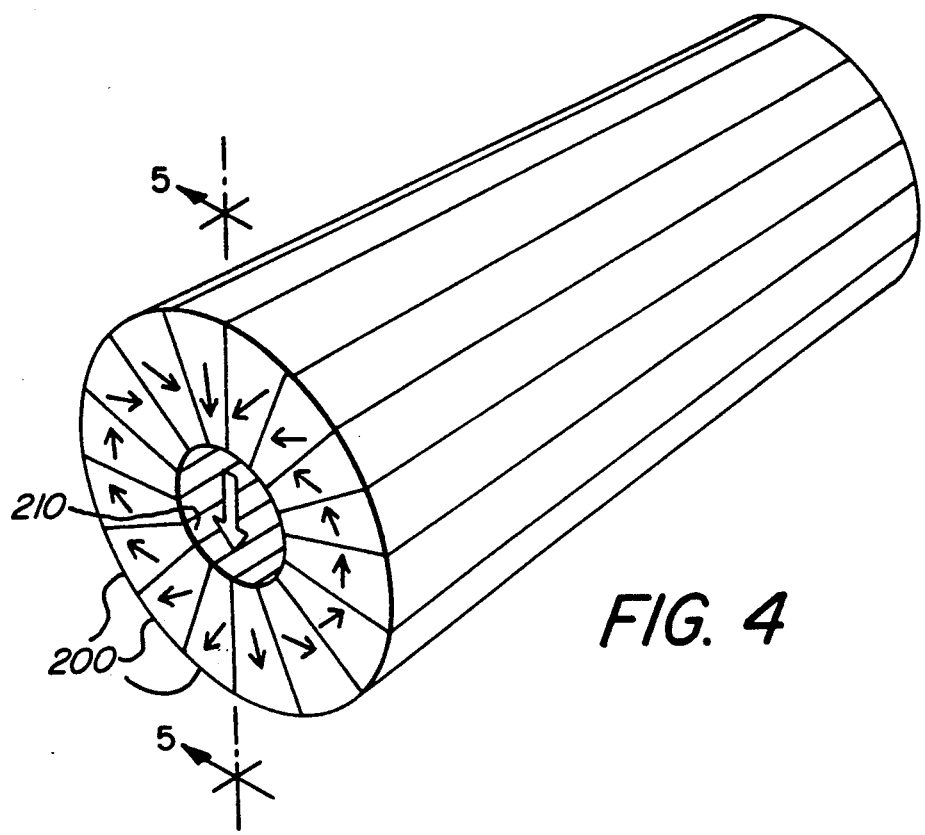
FIG. 4 is a perspective view of yet another embodiment of the present invention.
Figure 5:
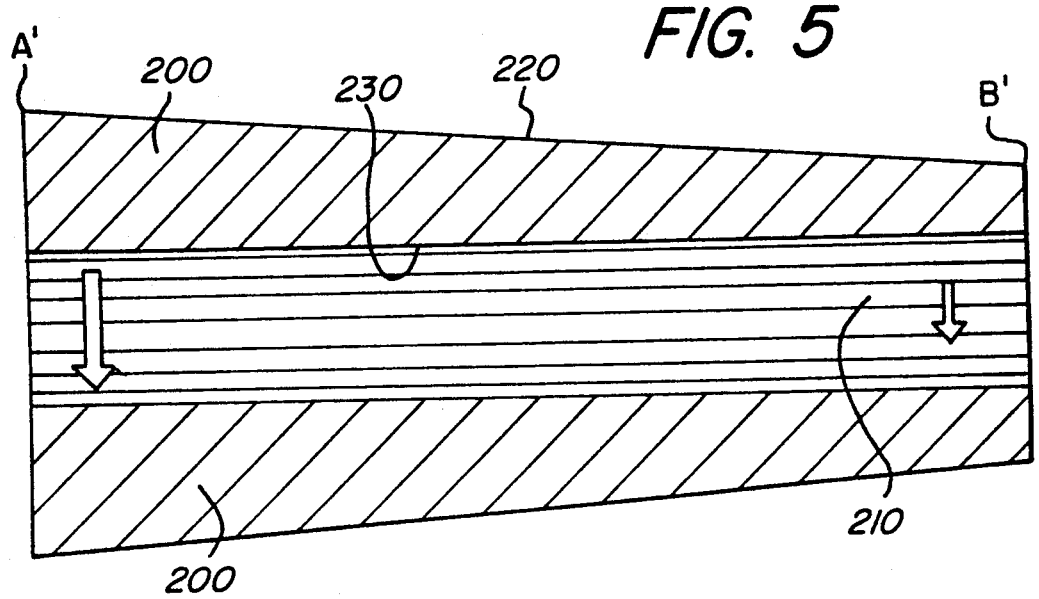
FIG. 5 is a cross section taken along line 5—5 in FIG. 4.

FIG. 4 and 5 illustrate yet another embodiment. In FIG. 4 a cylindrical tube is made from wedge shaped permanent magnets 200 forming a cylindrical bore 210. Each of the permanent magnets 200 have a magnetic axis with an orientation as indicated by the arrows thereon. The structure of the present invention is similar to a magic ring. A method of making a magic ring is disclosed in United States Statutory Invention Registration Number H591 published Mar. 7, 1989 entitled "Method of Manufacturing of a Magic Ring", which is herein incorporated by reference. However, the present invention is comprised of wedge shaped permanent magnets 200 that have a radially varying thickness while progressing along the longitudinal axis. FIG. 5 more clearly illustrates the varying radial thickness of wedge shaped permanent magnets 200. The radial distance between exterior surface 220 and interior surface 230 decreases from point A' to point B'. This results in a longitudinally varying transverse magnetic field.

While the present invention has been illustrated with respect to several embodiments, it will be obvious to those skilled in the art that various modifications may be made without departing from the spirit and scope of this invention.

What is claimed is:

1. A tubular structure having a longitudinally varying transverse magnetic field comprising:
   a plurality of tubular sections formed of permanent magnet material positioned adjacent each other forming a tube having a common longitudinal axis, each of said plurality of tubular sections formed from a magnetic material having a remanence, the remanence of each said plurality of tubular sections varying along the longitudinal axis and among the different tubular sections from a high remanence at one end of the structure to a low remanence at the other end of the structure, and each of the tubular sections being magnetized so as to have a uniform transverse magnetic field.

2. A tubular structure as in claim 1 wherein:

said plurality of tubular sections have a rectangular cross section.

3. A tubular structure as in claim 2 wherein:

each said plurality of tubular sections has a predetermined height and has a thickness along the longitudinal axis equal to one-half of the height of the rectangular cross section.

4. A tubular structure as in claim 3 wherein:

the total change in remanence from the high remanence to the low remanence is 6%.

* * * * *